(12) United States Patent
Won et al.

(10) Patent No.: US 6,858,548 B2
(45) Date of Patent: Feb. 22, 2005

(54) APPLICATION OF CARBON DOPED SILICON OXIDE FILM TO FLAT PANEL INDUSTRY

(75) Inventors: Tae Kyung Won, San Jose, CA (US); Quanyuan Shang, Saratoga, CA (US); William R. Harshbarger, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 74 days.

(21) Appl. No.: 10/125,961

(22) Filed: Apr. 18, 2002

(65) Prior Publication Data

US 2003/0198817 A1 Oct. 23, 2003

(51) Int. Cl.$^7$ .......................... H01L 21/31; H01L 21/469
(52) U.S. Cl. .......................... 438/786; 438/758; 438/778
(58) Field of Search .................. 438/758, 769, 438/778, 780, 781, 783, 786–790, 931, 30, 82, 90, 98, 99, 149, 158, 159, 197, 275, 311, 315, 334, 585, 587, 652

(56) References Cited

U.S. PATENT DOCUMENTS 4,894,352 A * 1/1990 Lane et al. .................. 438/763
5,638,251 A * 6/1997 Goel et al. .................. 361/313
5,849,644 A * 12/1998 Schuegraf .................. 438/790
5,989,998 A * 11/1999 Sugahara et al. ........... 438/623
6,001,747 A * 12/1999 Annapragada .............. 438/790
6,147,009 A * 11/2000 Grill et al. .................. 438/780
6,159,871 A   12/2000 Loboda et al. .............. 438/786
6,238,751 B1 * 5/2001 Mountsier .................. 427/574
6,441,491 B1 * 8/2002 Grill et al. .................. 257/759
6,479,110 B2 * 11/2002 Grill et al. .................. 427/577
2003/0111662 A1  6/2003 Cerny et al. ................. 257/40
2003/0215970 A1 11/2003 Yang et al.

* cited by examiner

Primary Examiner—John F. Niebling
Assistant Examiner—Stanetta Issac
(74) Attorney, Agent, or Firm—Moser, Patterson & Sheridan, LLP

(57) ABSTRACT

A process for depositing a low dielectric constant layer (k<3) on a flat panel display and a flat panel display. The process includes reacting one or more organosilicon compounds with an oxygen containing compound at an RF power level from about 0.345 W/cm$^2$ to about 1.265 W/cm$^2$. The flat panel display includes a plasma display panel having a first substrate, a plurality of barriers deposited on the first substrate, a second substrate, a low dielectric constant layer (k<3) deposited on the second substrate, and a plurality of ground electrodes formed between the barriers and the dielectric layer.

28 Claims, 3 Drawing Sheets

APPLICATION OF CARBON DOPED SILICON OXIDE FILM TO FLAT PANEL INDUSTRY

BACKGROUND OF THE INVENTION

1. Field of the Invention

The present invention generally relates to a flat panel display device and more particularly to dielectric layers within the flat panel display.

2. Description of the Related Art

Plasma display panels and liquid crystal displays are frequently used for flat panel displays. Liquid crystal displays (LCD) generally contain two glass substrates joined together with a layer of a liquid crystal material sandwiched therebetween. The glass substrates have conductive films coated thereon with at least one of the substrates being transparent such as an indium tin oxide (ITO) film. The substrates may be connected to a source of power to change the orientation of the liquid crystal material. Various areas of the liquid crystal cell can be accessed by proper patterning of the conductive films. More recently, thin film transistors (TFT) have been used to separately address areas of the liquid crystal cell at very fast rates. Such liquid crystal cells are useful for active matrix displays such as TV and computer monitors.

As the requirements for resolution of liquid crystal monitors increase, it has become desirable to address a large number of separate areas of the liquid crystal cell, called pixels. In a modern display panel, more than 1,000,000 pixels may be present. At least the same number of transistors are formed on the glass plates such that each pixel can be separately addressed and left in the switched state while other pixels are addressed. Generally, three transistors are formed on the glass plates per pixel.

One type of thin film transistor device used is the back channel etched thin film transistor (BCE TFT). A major CVD process step in conventional BCE TFT processing is the sequential deposition of three layers; an insulating dielectric layer of typically a gate silicon nitride, gate silicon oxide, or both, followed by an intrinsic (un-doped) amorphous silicon (i-a-Si) layer, and then a thin layer of phosphorus-doped amorphous silicon ($N^+$-a-Si).

Plasma display panels generally include an upper substrate and a lower substrate. The upper substrate includes a dielectric layer deposited on scan electrodes and sustain electrodes. The lower substrate includes a dielectric layer formed on the surface of the lower substrate.

As device dimensions have diminished and device switching speeds have increased, circuit operation has become increasingly limited by capacitance delays due to the close proximity of conductor lines. Efforts to minimize the capacitance have been devoted to improving the quality of the dielectric materials forming the layers separating the conductor interconnection pattern. Silicon containing materials, such as silicon oxide and silicon nitride, have been used as dielectric materials for forming inter-metal dielectric (IMD) layers. The dielectric constants of these materials, whose values range from about 4 to about 8, result in undesirably high capacitance leading to increased signal coupling and cross-talk between adjacent conductor lines. Dielectric materials with lower dielectric constants suitable for forming dielectric layers have been developed such as, but not limited to, silsesquioxane spin-on-glass (SOG) dielectric materials, amorphous carbon dielectric materials, and organic polymer spin-on-polymer (SOP) dielectric materials, which exhibit dielectric constants in a range from about 2.5 to about 3.3. However, the low dielectric materials are porous and typically are used with liner layers having high dielectric constants that increase the overall dielectric constant of a multi-component dielectric layer.

The organic materials prepared by spin-coating technology generally present integration problems, such as poor adhesion, thermal instability and anisotropy of the dielectric constant. Therefore, there remains a need for dielectric layers having low dielectric constants for use as insulating layers in sub-micron flat panel displays.

SUMMARY OF THE INVENTION

Embodiments of the present invention generally include depositing a low dielectric constant (k<3) layer on a flat panel display by reacting one or more organosilicon compounds with oxygen or an oxygen containing compound at an RF power level from about 0.345 $W/cm^2$ to about 1.265 $W/cm^2$, e.g., from about 600 W to about 2200 W for a 370 mm by 470 mm sized substrate.

Embodiments of the present invention also include a plasma display panel comprising a first substrate, a plurality of barriers deposited on the first substrate, a second substrate, the low dielectric constant layer (k<3) deposited on the second substrate, and a plurality of ground electrodes formed between the barriers and the dielectric layer.

Embodiments of the present invention further include a flat panel display comprising a first substrate including a display area having pixel electrodes, thin film transistors, and driving circuits, and a second substrate facing the lower substrate and having a common electrode. The thin film transistors comprise the low dielectric constant layer (k<3).

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
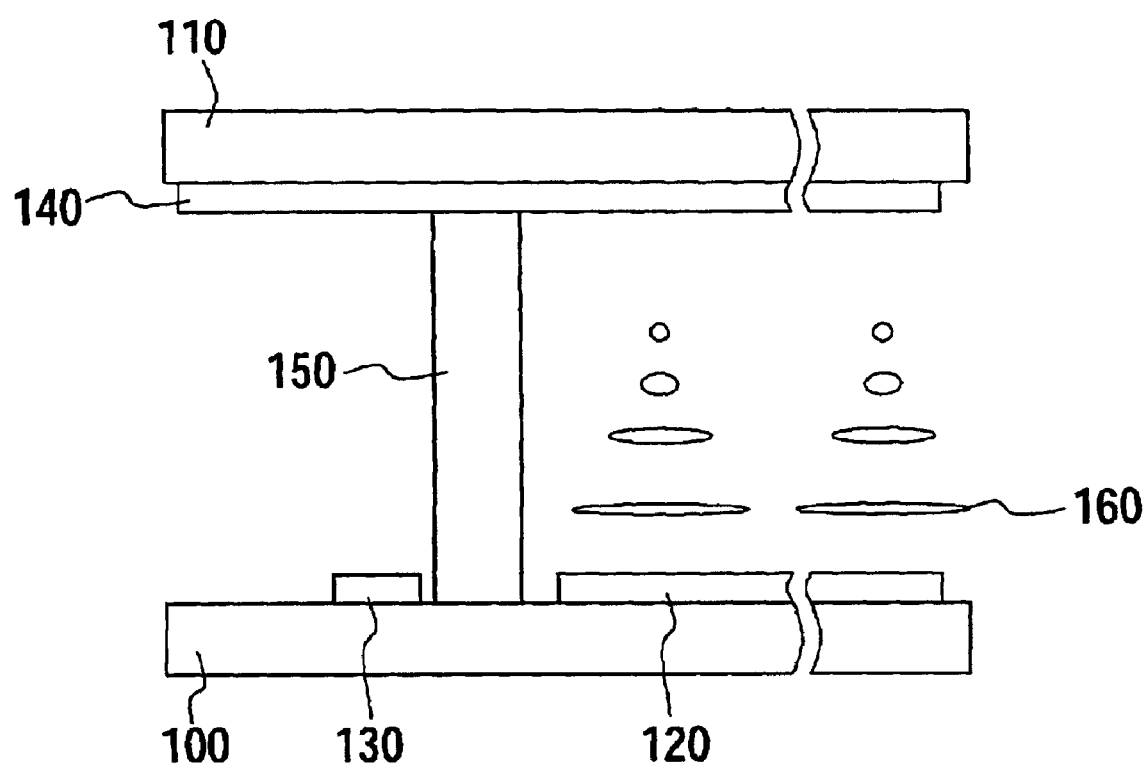
FIG. 1 is a cross-sectional view of a liquid crystal display used in embodiments of the present invention.

Embodiments of the invention provide low dielectric constant layers (k<3) in flat panel displays. The dielectric layer comprises a carbon doped silicon oxide which is an oxidized organosilane or organosiloxane layer comprising carbon. The deposition of oxidized organosilane or organosiloxane layers comprising carbon on 200 mm diameter semiconductor substrates is described in U.S. Pat. No. 6,348,725 which issued Feb. 19, 2002, and is incorporated by reference herein. For 370 mm by 470 mm substrates, the carbon doped silicon oxide layer is deposited by plasma assisted oxidation of the organosilane or organosiloxane compounds using from about 600 W (0.345 $W/cm^2$) to about 2200 W (1.265 $W/cm^2$) of constant radio frequency (RF) power. The carbon doped silicon oxide dielectric layer can also be deposited using frequent breaks, such as changing chambers or providing cooling time, to improve porosity. The RF power is preferably provided at a high frequency such as between about 13 MHz and about 14 MHz. Intermittent RF power can operate at higher peak power levels and provide the same total power input as constant RF power at a lower power level.

Carbon that remains in the carbon doped silicon oxide dielectric layer contributes to low dielectric constants (k<3) and barrier properties. The remaining carbon is between about 2.5% and about 10% by atomic percent excluding hydrogen, and preferably includes sufficient C—H or C—F bonds to provide hydrophobic properties to the carbon doped silicon oxide dielectric layer resulting in significantly lower dielectric constants and improved moisture barrier properties.

The carbon doped silicon oxide dielectric layers are produced from silicon compounds that include carbon in organo groups that are not readily removed by oxidation at processing conditions. Preferably the —C—H bonds are included such as in alkyl or aryl groups, or fluorinated carbon derivatives thereof. Suitable organo groups also can include alkenyl and cyclohexenyl groups and functional derivatives. The organo silicon compounds include:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| dimethylsilanediol, | $(CH_3)_2$—$Si$—$(OH)_2$ |
| ethylsilane, | $CH_3$—$CH_2$—$SiH_3$ |
| phenylsilane, | $C_6H_5$—$SiH_3$ |
| diphenylsilane, | $(C_6H_5)_2$—$SiH_2$ |
| diphenylsilanediol, | $(C_6H_5)_2$—$Si$—$(OH)_2$ |
| methylphenylsilane, | $C_6H_5$—$SiH_2$—$CH_3$ |
| disilanomethane, | $SiH_3$—$CH_2$—$SiH_3$ |
| bis(methyl-silano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methyl-silano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | $-(SiH_2CH_2)_3-$ (cyclic) |
| 1,3-dimethyl-disiloxane, | $CH_3$—$SiH_2$—$O$—$SiH_2$—$CH_3$ |
| 1,1,3,3-tetra-methyldisiloxane, | $(CH_3)_2$—$SiH$—$O$—$SiH$—$(CH_3)_2$ |
| hexamethyldi-siloxane, | $(CH_3)_3$—$Si$—$O$—$Si$—$(CH_3)_3$ |
| 1,3-bis(silano-methylene)di-siloxane, | $(SiH_3$—$CH_2$—$SiH_2)_2 O$ |
| bis(1-methyldi-siloxanyl)methane, | $(CH_3$—$SiH_2$—$O$—$SiH_2)_2 CH_2$ |
| 2,2-bis(1-methyldi-siloxanyl)propane, | $(CH_3$—$SiH_2$—$O$—$SiH_2)_2 C(CH_3)_2$ |
| 2,4,6,8-tetramethyl-cyclotetrasiloxane, | $-(SiHCH_3$—$O)_4-$ (cyclic) |
| octamethylcyclo-tetrasiloxane, | $-(Si(CH_3)_2$—$O)_4-$ (cyclic) |
| 1,3,5,7,9-penta-methylcyclopenta-siloxane, | $-(SiHCH_3$—$O)_5-$ (cyclic) |
| 1,3,5,7-tetra-silano-2,6-dioxy-4,8-dimethylene, | $-(SiH_2$—$CH_2$—$SiH_2$—$O)_2-$ (cyclic) |
| 2,4,6-trisilane-tetrahydropyran, and | —$SiH_2$—$CH_2$—$SiH_2$—$CH_2$—$SiH_2$—$O$— (cyclic) |
| 2,5-disilane-tetrahydrofuran. | —$SiH_2$—$CH_2$—$CH_2$—$SiH_2$—$O$— (cyclic) |

The organo silicon compounds are reacted during deposition with oxygen ($O_2$) or oxygen containing compounds such as nitrous oxide ($N_2O$), ozone ($O_3$), carbon dioxide ($CO_2$), and water ($H_2O$), preferably $O_2$, such that the carbon content of the deposited dielectric film is from about 2.5% to about 20% by atomic percent excluding hydrogen, preferably from about 3% to about 10%. The oxidized carbon doped organo silicon dielectric layer has a dielectric constant of about 3.0 or less and has excellent barrier properties.

Oxygen and oxygen containing compounds are preferably dissociated to increase reactivity when necessary to achieve a desired carbon content in the deposited dielectric film. The RF power can be coupled to the deposition chamber to increase dissociation of the oxidizing compounds. The oxidizing compounds may also be dissociated in a microwave chamber prior to entering the deposition chamber to reduce excessive dissociation of the silicon containing compounds. Deposition of the carbon doped silicon oxide dielectric layer can be continuous or discontinuous. Although deposition preferably occurs in a single deposition chamber, the dielectric layer can be deposited sequentially in two or more deposition chambers. Furthermore, the RF power can be cycled or pulsed to reduce heating of the substrate and promote greater porosity in the deposited film. During deposition of the carbon doped silicon oxide dielectric layer, the substrate is maintained at a temperature of from about 0° C. to about 500° C.

The organosilane and organosiloxane compounds preferably include at least one compound having the structure:

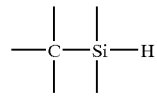

wherein each Si is bonded to one or two carbon atoms, and C is included in an organo group, preferably alkyl or alkenyl groups such as —$CH_3$, —$CH_2$—$CH_3$, —$CH_2$—, or —$CH_2$—$CH_2$—, or fluorinated carbon derivatives thereof. The carbon atoms in the fluorinated derivatives may be partially or fully fluorinated to replace hydrogen atoms. When an organosilane or organosiloxane compound includes two or more Si atoms, each Si is separated from another Si by —O—, —C—, or —C—C—, wherein C is included in an organo group, preferably alkyl or alkenyl groups such as —$CH_2$—, —$CH_2$—$CH_2$—, —$CH(CH_3)$—or —$C(CH_3)_2$—, or fluorinated derivatives thereof.

The preferred organosilane and organosiloxane compounds are gases or liquids near room temperature and can be volatilized above about 10 Torr. Preferred organosilanes and organosiloxanes include:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| disilanomethane, | $SiH_3$—$CH_2$—$SiH_3$ |
| bis(methyl-silano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methyl-silano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | $-(SiH_2CH_2)_3-$ (cyclic) |
| 1,3-dimethyldisiloxane, | $CH_3$—$SiH_2$—$O$—$SiH_2$—$CH_3$ |
| 1,1,3,3-tetra-methyldisiloxane, | $(CH_3)_2$—$SiH$—$O$—$SiH$—$(CH_3)_2$ |
| 1,3-bis(silano-methylene)di-siloxane, | $(SiH_3$—$CH_2$—$SiH_2)_2 O$ |
| bis(1-methyl di siloxanyl)methane, | $(CH_3$—$SiH_2$—$O$—$SiH_2)_2 CH_2$ |
| 2,2-bis(1-methyldi-siloxanyl)propane, | $(CH_3$—$SiH_2$—$O$—$SiH_2)_2 C(CH_3)_2$ |

-continued

| | |
|---|---|
| 1,3,5,7,9-pentamethylcyclopentasiloxane, | $-(SiHCH_3-O)_5-$ (cyclic) |
| 1,3,5,7-tetrasilano-2,6-dioxy-4,8-dimethylene | $-(SiH_2-CH_2-SiH_2-O)_2-$ (cyclic) |
| 2,4,6-trisilane-tetrahydropyran, and | $-SiH_2-CH_2-SiH_2-CH_2-SiH_2-O-$ (cyclic) |
| 2,5-disilane-tetrahydrofuran, | $-SiH_2-CH_2-CH_2-SiH_2-O-$ (cyclic) | and fluorinated carbon derivatives thereof, such as:

| | |
|---|---|
| trifluoromethylsilane, | $CF_3-SiH_3$ |
| 1,2-disilano-tetrafluoroethylene | $SiH_3-CF_2-CF_2-SiH_3$ |
| 1,2-bis(trifluoromethylsilano)tetrafluoroethane, | $CF_3-SiH_2-CF_2-CF_2-SiH_2-CF_3$ |
| 2,2-disilano-hexafluoropropane, | $SiH_3-C(CF_3)_2-SiH_3$ |
| 1,3-bis(silano-difluoromethylene)disiloxane, | $(SiH_3-CF_2-SiH_2)_2O$ |
| bis(1-trifluoromethyldisiloxanyl)difluoromethane, | $(CF_3-SiH_2-O-SiH_2)_2CF_2$ |
| 2,4,6-trisilane-tetrafluoropyran, and | $-SiH_2-CF_2-SiH_2-CF_2-SiH_2-O-$ (cyclic) |
| 2,5-disilanetetrafluorofuran. | $-SiH_2-CF_2-CF_2-SiH_2-O-$ (cyclic) |

The hydrocarbon groups in the organosilanes and organosiloxane may be partially or fully fluorinated to convert C—H bonds to C—F bonds. Many of the preferred organosilane and organosiloxane compounds are commercially available. A combination of two or more of the organosilanes or organosiloxanes can be employed to provide a blend of desired properties such as dielectric constant, oxide content, hydrophobicity, film stress, and plasma etching characteristics.

The organosilane and organosiloxane compounds are oxidized during deposition by plasma assisted reaction. The oxidized compounds adhere to contacted surfaces, such as a patterned layer of a flat panel display substrate, to form a deposited dielectric film. The deposited dielectric films may be cured at low pressure and at temperatures from about 100° C. to about 450° C., preferably above about 400° C. to stabilize the barrier properties of the films. When the substrate is maintained at a temperature of from about 200° C. to about 500° C. during deposition, the curing step may be eliminated.

Plasma-enhanced chemical vapor deposition (PECVD) is a process widely used in the manufacture of semiconductor devices and flat panel displays for depositing layers of electronic materials on various substrates. In a PECVD process, a substrate is placed in a vacuum deposition chamber equipped with a pair of parallel plate electrodes. The substrate is generally mounted on a susceptor, which is also the lower electrode. A flow of a reactant gas is provided in the deposition chamber through a gas inlet manifold that also serves as the upper electrode. An RF voltage is applied between the two electrodes, which generates an RF power sufficient to cause plasma to be formed in the reactant gas. The plasma causes the reactant gas to decompose and deposit a layer of a desired material, e.g., a metal such as aluminum or copper, on the surface of the substrate. Additional layers of other electronic materials may be deposited on the first layer by flowing into the deposition chamber a reactant gas containing the material of the additional layer to be deposited. Each reactant gas is subjected to plasma, which results in the deposition of a layer of the desired material.

A typical deposition process and its processing conditions are illustrated below and in Table 1. The following process parameters apply to deposition of an insulating dielectric layer on a 370 mm by 470 mm substrate using a parallel plate RF PECVD chamber, and in particular, an "AKT 1600 PECVD" system fabricated and sold by Applied Materials, Inc., Santa Clara, Calif.

TABLE 1

| Processing Parameters | |
|---|---|
| Trimethylsilane $((CH_3)_3-SiH)$ | 600 sccm to 2100 sccm |
| Oxygen $(O_2)$ | 200 sccm to 2000 sccm |
| RF Power | 600 W (0.345 W/cm$^2$) to 2200 W (1.265 W/cm$^2$) |
| Pressure | 3 torr to 4.5 torr |
| Electrode Spacing | 500 mils to 700 mils |
| Substrate Temperature | 250° C. to 400° C. |

The above process conditions result in the deposition of a PECVD carbon doped silicon oxide dielectric layer with improved barrier characteristics for the subsequent deposition of an amorphous silicon layer, as demonstrated in Table 2. The dielectric layer obtained from trimethylsilane has sufficient C—H bonds to be hydrophobic, and is an excellent moisture barrier. Deposition of a hydrophobic carbon doped silicon oxide dielectric layer has a surprising and unexpected result of converting subsequent hydrophilic layers to hydrophobic layers.

TABLE 2

| Dielectric Layer Properties | |
|---|---|
| Refractive Index | 1.37 to 1.41 |
| Film Stress | 0.4 dyne/cm$^2$ to 0.8 dyne/cm$^2$ |
| Si—O Bond Peak Position | 1040 cm$^{-1}$ to 1050 cm$^{-1}$ |
| Si—CH$_3$ Bond Peak Position | 1270 cm$^{-1}$ to 1275 cm$^{-1}$ |
| Relative Carbon Content in the Film | 2.9% to 5.6% |
| Deposition Rate | 1200 Å/min to 8500 Å/min |
| Thickness Uniformity | 6.0% to 15.6% |
| Dielectric Constant | 2.8 to 3.3 |

FIG. 1 illustrates a liquid crystal display panel (LCD) used in an exemplary embodiment of the invention. The LCD includes a first substrate 100 and a second substrate 110. The LCD further includes a display area 120 having pixel electrodes, thin film transistors (TFT), either amorphous silicon or polycrystalline silicone, used as switching devices, and driving circuits 130 formed on the first substrate 100. A common electrode 140 is formed on the second substrate 110. The common electrode 140 faces the driving circuits 130 of the first substrate 100.

A sealant pattern 150 having an injection hole (not shown) is applied along the edges of the first substrate 100 and assembles the first substrate 100 and the second substrate 110. A liquid crystal layer 160 is injected into the region surrounded by the sealant pattern 150 and interposed between the substrates 100 and 110. The driving circuits 130 are located outside the region surrounded by the sealant pattern 150.

Figure 2:
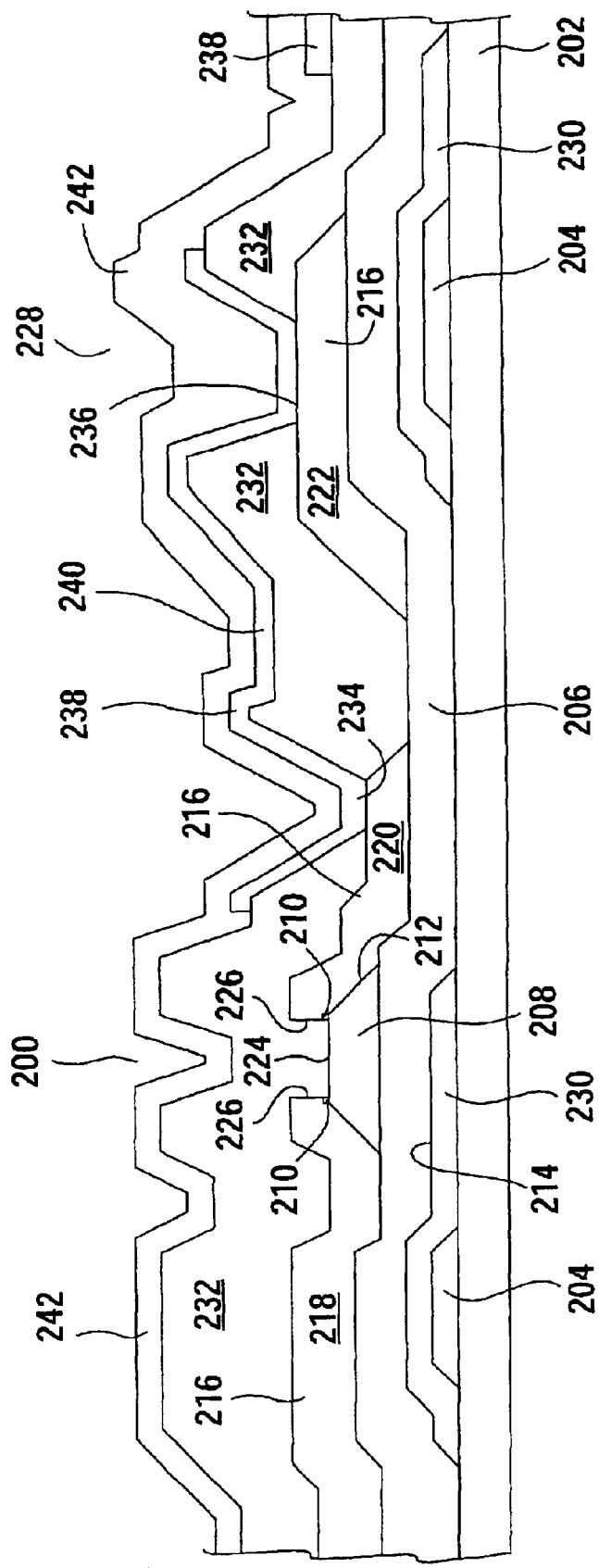
FIG. 2 is a cross-sectional view of a thin film transistor of an exemplary embodiment of the invention.

FIG. 2 illustrates an exemplary embodiment of the invention utilizing a tri-layer PECVD processed back channel etched thin film transistor (BCE TFT) 200 which may be used in a LCD. A TFT substrate 202 of glass coated with patterned metal 204 such as aluminum or copper is first coated with a layer of the carbon doped silicon oxide dielectric material 206. An intrinsic or un-doped amorphous silicon layer 208 is then deposited on the dielectric layer 206. In the next deposition process, a layer of doped amorphous silicon 210 is deposited on the intrinsic amorphous silicon layer 208. A preferred dopant is phosphorus. However, other dopant elements such as antimony, arsenic and boron may be used in the present invention. The amorphous silicon layers 208 and 210 are selectively etched to leave discrete areas 212 over the gate portions 214 on the dielectric layer 206.

A source-drain (S-D) layer 216 then is deposited, preferably formed from a plurality of metal layers for large displays. For small displays, the S-D layer 216 can be a single metal layer, such as aluminum or molybdenum. A preferable large device S-D multilayer 216 is formed by depositing a first barrier layer of molybdenum to a thickness on the order of 500 Angstroms. A second conductivity enhancing layer of aluminum or aluminum alloy then is deposited to a thickness of about 5000 Angstroms. A third barrier layer of molybdenum or molybdenum alloy then is deposited to a thickness of about 300 Angstroms. Alternatively, only the first two layers are deposited.

The S-D layer 216 then is patterned to form a source portion 218, a drain portion 220 and a top capacitor contact portion 222. A transistor channel region 224 then is formed between the source portion 218 and drain portions 220 by removing the doped silicon layer 210 between the contact portions 226; which remain under the S-D metal portions 218 and 220. At this point the transistor 200 is electrically functional. The storage capacitor 228 also now is electrically functional and is formed by the contact portion 222 and the underlying portions of the insulator layer 206, the oxide layer 230 and the gate 214. Both the transistor 200 and the capacitor 228 can now be electrically tested, as desired.

A first passivation layer 232 then is deposited, preferably formed of the same material as the dielectric layer 206 to a thickness of about 7000 Angstroms. The first passivation layer 232 is patterned to form a drain contact opening 234 and a capacitor contact opening 236.

A pixel ITO layer 238 then is deposited and patterned to form the drain contact at the opening 234, the capacitor contact at the opening 236, and the pixel 240. The pixel 240 is not shown to scale and the section is offset to include both the transistor 200 and the capacitor structure 228, which are staggered from one another. The section does not fully illustrate the electrical separation between the column ITO and the pixel ITO 238. The TFT structure 200, then is completed by forming a final passivation layer 242. The final passivation layer 242 is formed to a thickness of about 2000–3000 Angstroms in the same manner as the first passivation layer 232.

Although described herein preferably with an inverted gate TFT, the low dielectric layer 206 may be utilized with any type of matrix. Preferably the matrix includes a non-linear control element, such as a thin film diode, MIM or TFT, however, the advantages of the low dielectric layer 206 are not restricted to any particular non-linear control element.

Figure 3:
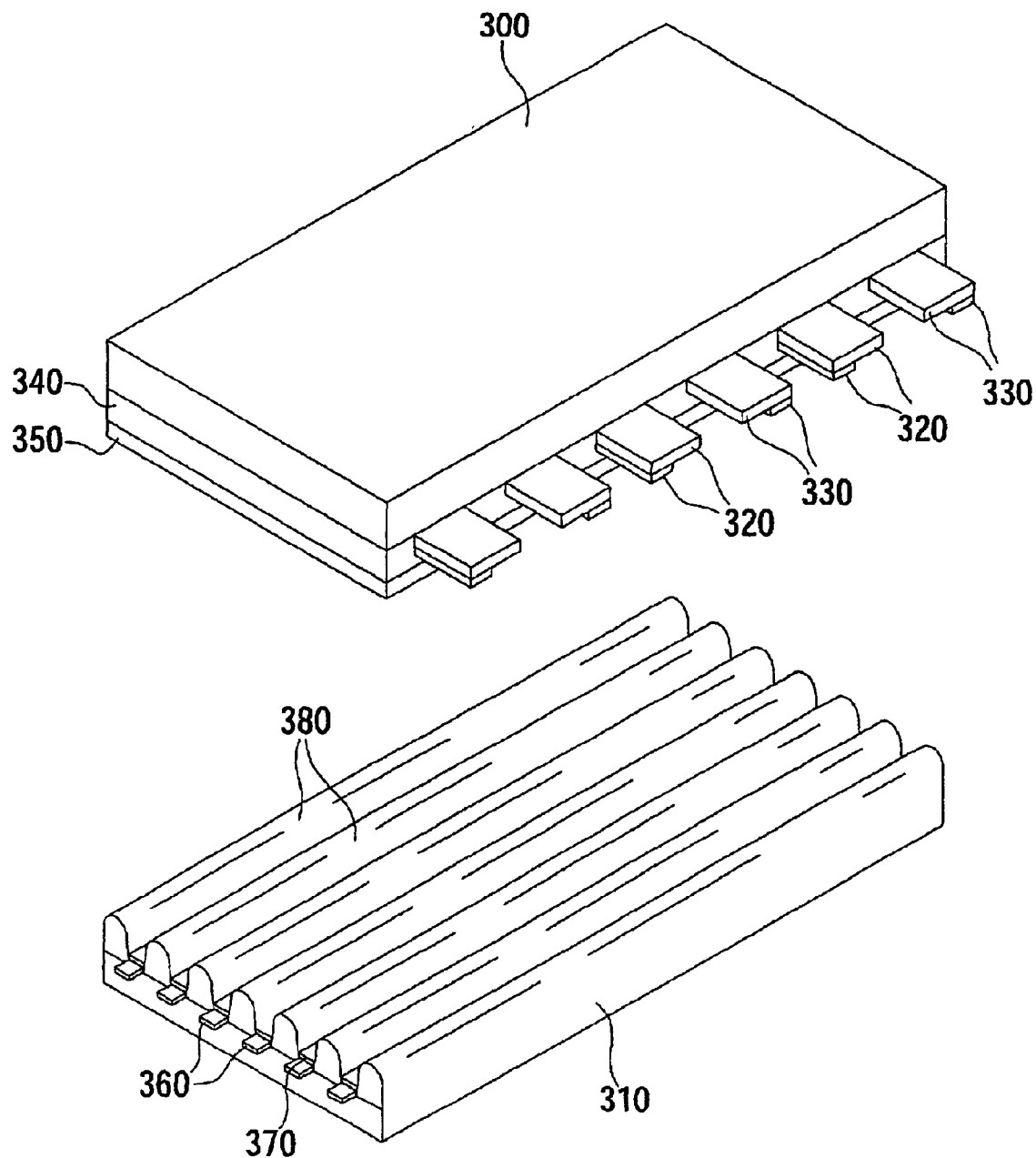
FIG. 3 is cross-sectional view of a plasma display panel of an alternative embodiment of the invention.

FIG. 3 illustrates a plasma display panel for use in an alternative embodiment of the present invention. The plasma display panel includes a second substrate 310 and a first substrate 300 that face each other. The first substrate 300 includes scan electrodes 320, sustain electrodes 330, a carbon doped silicon oxide upper dielectric layer 340, and a passivation layer 350. The scan electrodes 320 are formed in parallel to the sustain electrodes 330. The dielectric layer 340 is deposited on the scan electrodes 320 and the sustain electrodes 330. The lower substrate 310 further includes address electrodes 360, a lower carbon doped silicon oxide dielectric layer 370 formed on an entire surface of the lower substrate 310, which includes the address electrodes 360, and barriers 380 formed on the lower dielectric layer 370 between the respective address electrodes 360 to divide respective discharge cell regions.

While the foregoing is directed to embodiments of the present invention, other and further embodiments of the invention may be devised without departing from the basic scope thereof, and the scope thereof is determined by the claims that follow.

What is claimed is:

1. A process for depositing a low dielectric constant layer (k<3) on a glass substrate for forming a flat panel display, comprising reacting one or more organosilicon compounds with an oxygen containing compound at an RF power level from about 0.345 W/cm$^2$ to about 1.265 W/cm$^2$ to deposit a carbon doped silicon oxide layer on the glass flat panel display substrate.

2. The process of claim 1, wherein each silicon atom in each organosilicon compound is bonded to one or two carbon atoms and to at least one hydrogen atom, and wherein two or more silicon atoms in the same molecule are separated by no more than two carbon atoms or by no more than one oxygen atom.

3. The process of claim 1, wherein the organosilicon compounds are selected from a group consisting of methylsilane, dimethylsilane, trimethylsilane, disilanomethane, bis(methyl-silano)methane, 1,2-disilanoethane, 1,2-bis (methylsilano)ethane, 2,2-disilanopropane, 1,3,5-trisilano-2,4,6-trimethylene, 1,3-dimethyidisiloxane, 1,1,3,3-tetramethyldisiloxane, 1,3-bis (silanomethylene)di-siloxane, bis(1-methyldisiloxanyl) methane, 2,2-bis(1-methyl-disiloxanyl)propane, 1,3,5,7,9-pentamethylcyclopentasiloxane, 1,3,5,7-tetra-silano-2,6-dioxy-4,8-dimethylene, 2,4,6-trisilanetetrahydropyran, 2,5-disilanetetrahydrofuran, fluorinated carbon derivatives thereof, and combinations thereof.

4. The process of claim 1, wherein the oxygen containing compound is dissociated prior to mixing with the organosilicon compounds.

5. The process of claim 1, wherein the carbon doped silicon oxide layer comprises from about 2.5% to about 20% carbon by atomic percent excluding hydrogen.

6. The process of claim 1, wherein the carbon doped silicon oxide layer comprises from about 3% to about 10% carbon by atomic percent excluding hydrogen.

7. The process of claim 1, wherein the organosilicon compound consists of carbon, silicon, oxygen, and hydrogen.

8. The process of claim 1, wherein the organosilicon compound consists of carbon, silicon, and hydrogen.

9. The process of claim 1, wherein the flat panel display is a liquid crystal display comprising a thin film transistor.

10. The process of claim 9, wherein the process further comprises:
    depositing a silicon layer on the carbon doped silicon oxide layer; and
    depositing a doped silicon layer on the silicon layer.

11. The process of claim 10, wherein the depositing a silicon layer comprises depositing an amorphous silicon layer.

12. The process of claim 10, wherein depositing a doped silicon layer comprises depositing an N-type amorphous silicon layer.

13. The process of claim 1, wherein the flat panel display comprises a plasma display panel.

14. A process for depositing a low dielectric constant film on a glass substrate for forming a flat panel display, comprising:

depositing a dielectric layer having a low dielectric constant (k<3) on a patterned metal layer on the glass substrate from process gases comprising one or more organosilicon compounds and an oxygen containing compound at an RF power level from about 0.345 W/cm$^2$ to about 1.265 W/cm$^2$.

15. The process of claim 14, wherein each silicon atom in each organosilicon compound is bonded to one or two carbon atoms and to at least one hydrogen atom, and wherein two or more silicon atoms in the same molecule are separated by no more than two carbon atoms or by no more than one oxygen atom.

16. The process of claim 14, wherein the organosilicon compounds are selected from a group consisting of methylsilane, dimethylsilane, trimethylsilane, disilanomethane, bis(methyl-silano)methane, 1,2-disilanoethane, 1,2-bis (methylsilano)ethane, 2,2-disilanopropane, 1,3,5-trisilano-2,4,6-trimethylene, 1,3-dimethyidisiloxane, 1,1,3,3-tetramethyldisiloxane, 1,3-bis (silanomethylene)di-siloxane, bis(1-methyldisiloxanyl) methane, 2,2-bis(1-methyl-disiloxanyl)propane, 1,3,5,7,9-pentamethylcyclopentasiloxane, 1,3,5,7-tetra-silano-2,6-dioxy-4,8-dimethylene, 2,4,6-trisilanetetrahydropyran, 2,5-disilanetetrahydrofuran, fluorinated carbon derivatives thereof, and combinations thereof.

17. The process of claim 14, wherein the oxygen containing compound is dissociated prior to mixing with the organosilicon compounds.

18. The process of claim 14, wherein the dielectric layer comprises from about 2.5% to about 20% carbon by atomic percent excluding hydrogen.

19. The process of claim 14, wherein the dielectric layer comprises from about 3% to about 10% carbon by atomic percent excluding hydrogen.

20. The process of claim 14, wherein the organosilicon compound consists of carbon, silicon, oxygen, and hydrogen.

21. The process of claim 14, wherein the organosilicon compound consists of carbon, silicon, and hydrogen.

22. The process of claim 14, wherein the flat panel display is a liquid crystal display comprising a thin film transistor.

23. The process of claim 22, wherein the process further comprises:

depositing a silicon layer on the dielectric layer; and depositing a doped silicon layer on the silicon layer.

24. The process of claim 23, wherein the depositing a silicon layer comprises depositing an amorphous silicon layer.

25. The process of claim 23, wherein the depositing a doped silicon layer comprises depositing an N-type amorphous silicon layer.

26. The process of claim 14, wherein the flat panel display comprises a plasma display panel.

27. The process of claim 1, wherein the process further comprises:

depositing a hydrophobic silicon layer on the carbon doped silicon comprises layer; and depositing a hydrophobic doped silicon layer on the hydrophobic silicon layer.

28. The process of claim 14, wherein the process further comprises:

depositing a hydrophobic silicon layer on the dielectric layer; and depositing a hydrophobic doped silicon layer on the hydrophobic silicon layer.

* * * * *

UNITED STATES PATENT AND TRADEMARK OFFICE
CERTIFICATE OF CORRECTION

PATENT NO. : 6,858,548 B2
APPLICATION NO. : 10/125961
DATED : February 22, 2005
INVENTOR(S) : Tae Kyung Won, Quanyuan Shang and William R. Harshbarger It is certified that error appears in the above-identified patent and that said Letters Patent is hereby corrected as shown below:

In the Specification

Column 5, Line 7: Insert a comma after "2,6-dioxy-4,8-dimethylene"

In the Claims

Column 8, Claim 1, Line 22: Insert a space between "$W/cm^2$" and "to"

Column 8, Claim 3, Lines 36-37: Change "1,3-dimethyidisiloxane" to --1,3-dimethyldisiloxane--

Column 9, Claim 16, Lines 26-27: Change "1,3-dimethyidisiloxane" to --1,3-dimethyldisiloxane--

Column 10, Claim 27, Line 28: Change "comprises" to --oxide--

Signed and Sealed this

Twelfth Day of September, 2006

JON W. DUDAS
*Director of the United States Patent and Trademark Office*